(12) United States Patent
Wigney

(10) Patent No.: US 12,013,438 B2
(45) Date of Patent: Jun. 18, 2024

(54) BATTERY CAPACITY INDICATOR

(71) Applicant: VOLT TECHNOLOGY LIMITED, Hamilton (NZ)

(72) Inventor: Andrew James Wigney, Hamilton (NZ)

(73) Assignee: VOLT TECHNOLOGY LIMITED, Hamilton (NZ)

( * ) Notice: Subject to any disclaimer, the term of this patent is extended or adjusted under 35 U.S.C. 154(b) by 0 days.

(21) Appl. No.: 17/632,418

(22) PCT Filed: Aug. 4, 2020

(86) PCT No.: PCT/NZ2020/050081
§ 371 (c)(1),
(2) Date: Feb. 2, 2022

(87) PCT Pub. No.: WO2021/025561
PCT Pub. Date: Feb. 11, 2021

(65) Prior Publication Data
US 2022/0283230 A1 Sep. 8, 2022

(30) Foreign Application Priority Data
Aug. 6, 2019 (AU) .................. 2019902819

(51) Int. Cl.
*G01R 31/36* (2020.01)
*G01R 31/382* (2019.01)
*H01M 6/50* (2006.01)
*H01M 10/42* (2006.01)
*H01M 10/48* (2006.01)
*H02J 7/00* (2006.01)

(52) U.S. Cl.
CPC ....... *G01R 31/3646* (2019.01); *G01R 31/382* (2019.01); *H01M 6/505* (2013.01); *H01M 6/5061* (2013.01); *H01M 10/4257* (2013.01); *H01M 10/488* (2013.01); *H02J 7/0048* (2020.01); *H02J 7/005* (2020.01)

(58) Field of Classification Search
CPC ... G01R 31/00; G01R 31/3646; G01R 31/382
USPC .................................. 324/426–427, 432–435
See application file for complete search history.

(56) References Cited

U.S. PATENT DOCUMENTS

| 6,483,275 | B1 | 11/2002 | Nebrigic et al. |
| 7,058,525 | B2 | 6/2006 | Bertness et al. |
| 10,184,988 | B2 | 1/2019 | Bourilkov et al. |
| 2006/0139003 | A1 | 6/2006 | Fischer et al. |

(Continued)

FOREIGN PATENT DOCUMENTS

| CN | 109193882 A | 1/2019 |
| EP | 1250720 | 10/2002 |

*Primary Examiner* — Vincent Q Nguyen
(74) *Attorney, Agent, or Firm* — Leason Ellis LP

(57) ABSTRACT

The technology relates to a capacity indicator for use with a battery. One aspect of the technology provides an improved activation circuit for a capacity indicator that is easier to use and less prone to false alarms. A further aspect of the technology provides an improved indicator which is able to indicate battery capacity without requiring the use of expensive battery labels such as thermochromic strip. A further aspect of the technology provides a capacity determination circuit which is housed within a battery and which is able to provide a more accurate indication of battery capacity.

20 Claims, 6 Drawing Sheets

(56) References Cited

U.S. PATENT DOCUMENTS

| | | | |
|---|---|---|---|
| 2009/0058361 A1* | 3/2009 | John | H04B 5/0037 |
| | | | 307/104 |
| 2011/0084819 A1* | 4/2011 | Bergum | H01M 10/48 |
| | | | 340/384.1 |
| 2011/0178746 A1* | 7/2011 | Sugaya | H02J 7/005 |
| | | | 702/63 |
| 2012/0217971 A1 | 8/2012 | Deluca et al. | |
| 2016/0357354 A1* | 12/2016 | Chen | G06F 3/167 |

* cited by examiner

BATTERY CAPACITY INDICATOR

This patent application is a U.S. National Phase Application under 35 U.S.C. § 371 of International Patent Application No. PCT/NZ2020/050081, filed on Aug. 4, 2020, which claims priority from Australian Patent Application No. 2019902819, filed on Aug. 6, 2019, the entire disclosure all of which are incorporated herein by reference, as if expressly set forth in their respective entireties herein.

FIELD OF THE INVENTION

The present invention relates to a capacity indicator for use in a battery. This technology may find particular application in rechargeable batteries or intelligent batteries, however this should not be seen as limiting on the scope of the technology.

BACKGROUND TO THE INVENTION

Batteries are needed and used by almost every household worldwide. It is believed that a total of 350 AA and 150 AAA are batteries are purchased every second of every day. The main types of household batteries available are alkaline, lithium, nickel-metal hydride (NiMH) and nickel-cadmium (NiCD) batteries. There are primary batteries which are non-rechargeable and secondary batteries which are rechargeable from external power sources.

Batteries are provided with a rated capacity, typically expressed in milliamp hours (mAh) or amp hours (Ah). This rated capacity can be used to estimate the run time of a device if the current draw of the device is known. However, this requires a degree of knowledge on behalf of the battery user. Furthermore, in devices which require multiple batteries, the user must be able to determine whether the batteries are connected in series or parallel in order to make an accurate estimate of remaining run time.

Using rated capacity to determine the run-time of a device also only works when the batteries are new and haven't already been used. Even unused batteries self-discharge over time, meaning that the available energy may be much lower than the rated capacity of the battery.

Battery testers are available for determining the capacity remaining in a battery. These devices are typically much larger than the battery being tested, and have LEDs or a display for indicating the battery capacity to the user. These battery testers typically operate by monitoring the terminal voltage of the battery and in some cases applying a load to the battery to see how the terminal voltage varies. This approach can be used to provide an estimate of the capacity of the battery.

These battery testers are often costly, bulky and inconvenient to use. The accuracy of these testers also depends on how well the chemistry of the battery being tested matches the tester's internal reference chemistry data. Unless the battery tester is matched to the type of battery being tested they are likely to have limited accuracy.

There is therefore a need to provide a simple means of indicating the capacity or run-time of a battery to the average battery user.

One approach was patented by Duracell in U.S. Pat. No. 5,612,151. It uses a thermochromic liquid crystal strip which changes colour as it is heated. This thermochromic strip is activated when specific regions of the battery are pushed. Applying pressure to these regions connects a resistive element between the battery terminals which heats up, in turn heating the thermochromic strip. The result is a colour change in the thermochromic strip which can be used to provide a rough indication of the remaining capacity of the battery.

The advantage of the Duracell approach is that there is no longer a need to use a bulky external battery tester, as each battery has its own tester built-in. However, this approach has a number of limitations. Firstly, as the capacity indication is dependent on temperature, the resulting indication could vary depending on the temperature of the surrounding environment. In addition, as this approach relies on the heating of the thermochromic strip, there is a short delay as the strip heats up. This heating of the thermochromic strip also places a load on the battery which causes the battery to discharge as it is being tested. As a result, batteries that employ this technology typically have activation regions which require a forceful press to activate, thereby reducing the likelihood that the testing circuit would be inadvertently activated which would drain the battery when not required. A further downside of requiring a forceful press on the activation regions means that the testing circuit could be difficult to activate by children, the frail or elderly.

OBJECT OF THE INVENTION

It is an object of the invention to provide an improved battery capacity indicator and/or battery comprising a battery capacity indicator.

Alternatively, it is an object of the invention to provide a battery capacity indicator and/or a battery comprising a battery capacity indicator which at least partially addresses one or more of the issues outlined above.

Alternatively, it is an object of the invention to at least provide the public with a useful choice.

SUMMARY OF THE INVENTION

According to a first aspect of the technology, there is provided a battery capacity indicator.

According to a second aspect of the technology, there is provided a battery comprising a battery capacity indicator.

According to a further aspect of the technology, there is provided a battery comprising electronics which are configured to communicate one or more parameters of the battery to a user.

According to a further aspect of the technology, there is provided a battery capacity indicator comprising:
   an activation circuit;
   a capacity determination circuit;
   an indicator; and
   wherein the activation circuit is configured to activate the capacity determination circuit upon receiving an external input,
   wherein the capacity determination circuit is configured to determine a capacity of a power source of a battery, and to relay a signal representative of said capacity to the indicator,
   wherein the indicator is configured to indicate the capacity to a user, and
   wherein the capacity determination circuit is configured to be housed in a battery.

According to a further aspect of the technology, there is provided a battery comprising:
   a power source;
   a housing comprising a positive terminal and a negative terminal; and at least one electronic circuit operatively connected between the power source and the positive and/or negative terminals of the battery, wherein the electronic circuit is configured, upon receiving an external input, to communicate at least one parameter of the battery externally to the housing.

According to a further aspect of the technology, there is provided a battery capacity indicator comprising:
an activation circuit;
a capacity determination circuit; and
an indicator;
wherein the activation circuit is configured to activate the capacity determination circuit upon receiving a sequence of external inputs,
wherein the capacity determination circuit is configured to determine capacity information of a power source of a battery, and to relay a signal representative of said capacity to the indicator,
wherein the indicator is configured to indicate the capacity information to a user, and wherein the capacity determination circuit is configured to be housed in a battery.

According to a further aspect of the technology, there is provided a battery comprising:
a housing containing:
a power source; and
a capacity determination circuit;
an activation circuit; and
an indicator;
wherein the activation circuit is configured to activate the capacity determination circuit upon receiving a sequence of external inputs,
wherein the capacity determination circuit is configured to determine capacity information of the power source, and to relay a signal representative of said capacity to the indicator,
wherein the indicator is configured to indicate the capacity information to a user.

In one form of the technology the at least one electronic circuit comprises the battery capacity indicator of the previous aspect of the technology, wherein the at least one parameter of the battery comprises the capacity of the power source.

Preferably, the battery may be a rechargeable battery. That is, the power source may be a rechargeable power source. For example, the battery may include a lithium- or nickel-based chemistry such as Li-ion, Li-po, NiMH or NiCD. In one embodiment the power source may include one or more lithium ion cells.

Preferably, the housing may have an AA or AAA form factor, however this should not be seen as limiting on the technology.

Preferably, the activation circuit may be configured to switch the electronic circuit/capacity determination circuit between a low-power state or off state and an active state. For example, the activation circuit may be configured to provide an interrupt to a processor, or vary one or more power rails within the electronic circuit/capacity determination circuit.

Preferably, in the low-power state, the current draw of the electronic circuit/capacity determination circuit may be less than 10 μA.

Preferably, the activation circuit may comprise an input means for receiving the external input. The input means may comprise a sensor such as an accelerometer, microphone, light sensor, pressure sensor or gyroscope, or a combination of sensors. Alternatively, the input means may be touch-based, for example a mechanical, capacitive, inductive, or resistive touch interface or button.

Preferably, the activation circuit may require a plurality of external inputs prior to activation.

Preferably, the indicator may be a visual indicator such as a light emitting diode (LED). However in alternative embodiments the indicator may be an audible indicator or tactile indicator such as a buzzer, speaker or vibration motor. In some embodiments the indicator may be configured to indicate the capacity through a plurality of indication modes.

Preferably, the indicator may be located inside the housing. However, in alternative embodiments, the indicator may be located externally to the housing, for example embedded in or positioned under a label which is external to at least a portion of the housing.

Preferably, the housing may comprise a translucent or transparent region. The transparent or translucent region may be configured such that the light from the visual indicator is visible outside of the battery housing. It should be appreciated that the label may also include a transparent or translucent region to allow the light from the visual indicator to be more readily visible.

Preferably, the electronic circuit/capacity determination circuit may comprise a processor. However, in alternative embodiments the electronic circuit/capacity determination circuit may comprise discrete electronics.

Preferably, the electronic circuit/capacity determination circuit may be configured to determine the capacity of the battery by one or more of the following methods:
Measuring the voltage of the power source;
Accumulating the charge discharged from or charged into the power source (for example, coulomb counting);
Calculating the internal resistance of the power source, for example by measuring the voltage of the power source at one or more load currents;
Estimating the capacity of the battery based on time, i.e. approximating the self-discharge of the battery; and
Comparing the discharge response of the battery to known discharge curves for the given battery chemistry.

Preferably, the at least one parameter/capacity may be one or more of the following:
The remaining capacity of the battery (for example, relative or absolute remaining capacity);
The rated capacity of the battery;
The voltage of the power source, for example the instantaneous, average, or historic voltage(s) such as maximum or minimum values observed;
The current flowing into or out of the power source, for example the instantaneous, average, or historic current(s) such as maximum or minimum values observed;
The temperature of the power source, for example the instantaneous, average, or historic temperature(s) such as maximum or minimum values observed;
An estimate of the amount of time the battery will continue to operate based on the present or average discharge current;
An estimate of the amount of time until the battery is charged;
An indication of the state of health of the battery. For example, in a rechargeable battery the electronics may provide an indication of how the maximum capacity of the battery has degraded from the rated capacity over time/charge cycles; and
Historic data about the battery, for example the age of the battery, the number of charge/discharge cycles.

Advantages of the present technology should be apparent from the present disclosure, although these may include a battery capacity indicator that is easier to use, lower cost, smaller size, and/or more accurate than existing product offerings.

Further aspects of the technology, which should be considered in all its novel aspects, will become apparent to those skilled in the art upon reading of the following description which provides at least one example of a practical application of the technology.

BRIEF DESCRIPTION OF THE DRAWINGS

One or more embodiments of the technology will be described below by way of example only, and without intending to be limiting, with reference to the following drawings, in which.

BRIEF DESCRIPTION OF PREFERRED EMBODIMENT(S)

Battery Overview

In a broad sense, a preferred embodiment of the present technology relates to a battery capacity indicator. To aid the foregoing discussion, the components of this embodiment at a high-level are first discussed with reference to FIG. 1 below.

Figure 1:
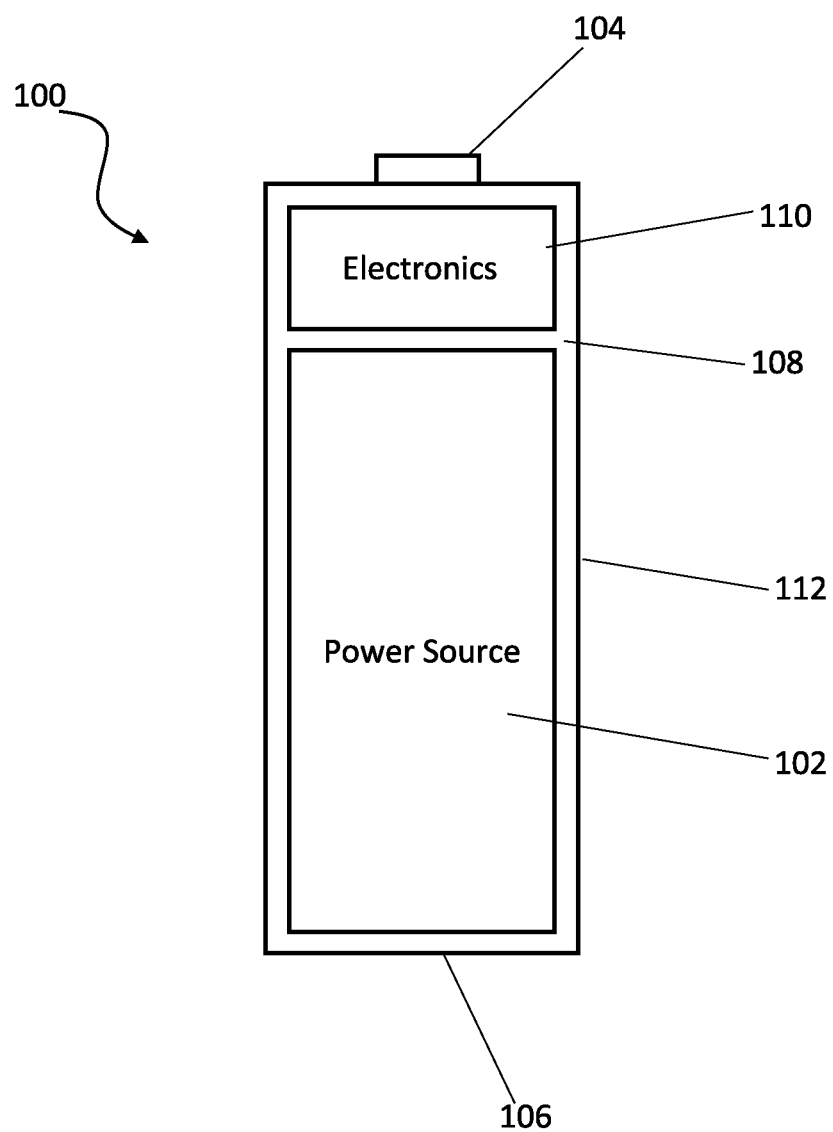
FIG. 1 shows a simplified diagram of a battery according to an embodiment of the present technology.

FIG. 1 shows a simplified view of a battery 100 according to an embodiment of the present technology. For simplicity of the foregoing discussion, the battery 100 is depicted as an AA battery as will be known to those skilled in the art. However, this should not be seen as limiting on the technology, and other battery sizes may be used without departing from the scope of the technology. For example, the battery 100 may have an AA, AAA, C, D, 9V, coin cell, button cell, or any other form factor known to those in the art, including for example mobile phone, drone, and vehicle battery forms.

The battery 100 comprises a power source 102 which may comprise one or more primary (non-rechargable) or secondary (rechargeable) cells. The power source 102 is operatively connected to the positive 104 and negative terminals 106 of the battery 100, in order to provide the output voltage of the battery. The positive terminal 104 and negative terminal 106 are comprised as part of a housing 108. The power source 102 is housed inside the housing 108.

A further aspect of the present technology is the inclusion of electronics 110 within the housing 108 of the battery 100. Inclusion of electronics 110 within the battery 100 may provide a number of advantages including the ability to:

Provide an output voltage which is different to the power source 102 voltage;

Regulate the charging of the internal power source 102;

Monitor the health and capacity of the internal power source 102; and

Provide further smart features as described herein.

Throughout the present specification, reference to "intelligent" or "smart" batteries should be understood to include batteries that incorporate electronics 110 to supplement or otherwise provide additional functionality to a battery other than solely the supply of power. One application for the inclusion of electronics 110 within the housing 108 of a battery is described in PCT Publication No. WO 2017/043979, the contents of which are herein incorporated in their entirety by reference. One embodiment described in WO 2017/043979 relates to the use of electronics 110 to regulate the internal power source voltage to provide a constant or near constant output voltage. A battery employing this technology would therefore be incompatible with existing capacity determination circuits which rely on measurement of the output voltage as an indication of the capacity of the battery.

It should be appreciated that, while the electronics 110 are shown as being located entirely within the housing 108 of the battery 100, one or more components of the electronics 110 may instead or additionally be located within a separate part of the battery 100 such as the terminals 104, 106 or embedded in or otherwise positioned under the label 112. The label 112 is external to at least a portion of the housing 108, for example in various embodiments it may surround or be adhered to the outer surface of the housing 108.

Overview of the Electronics

Figure 2:
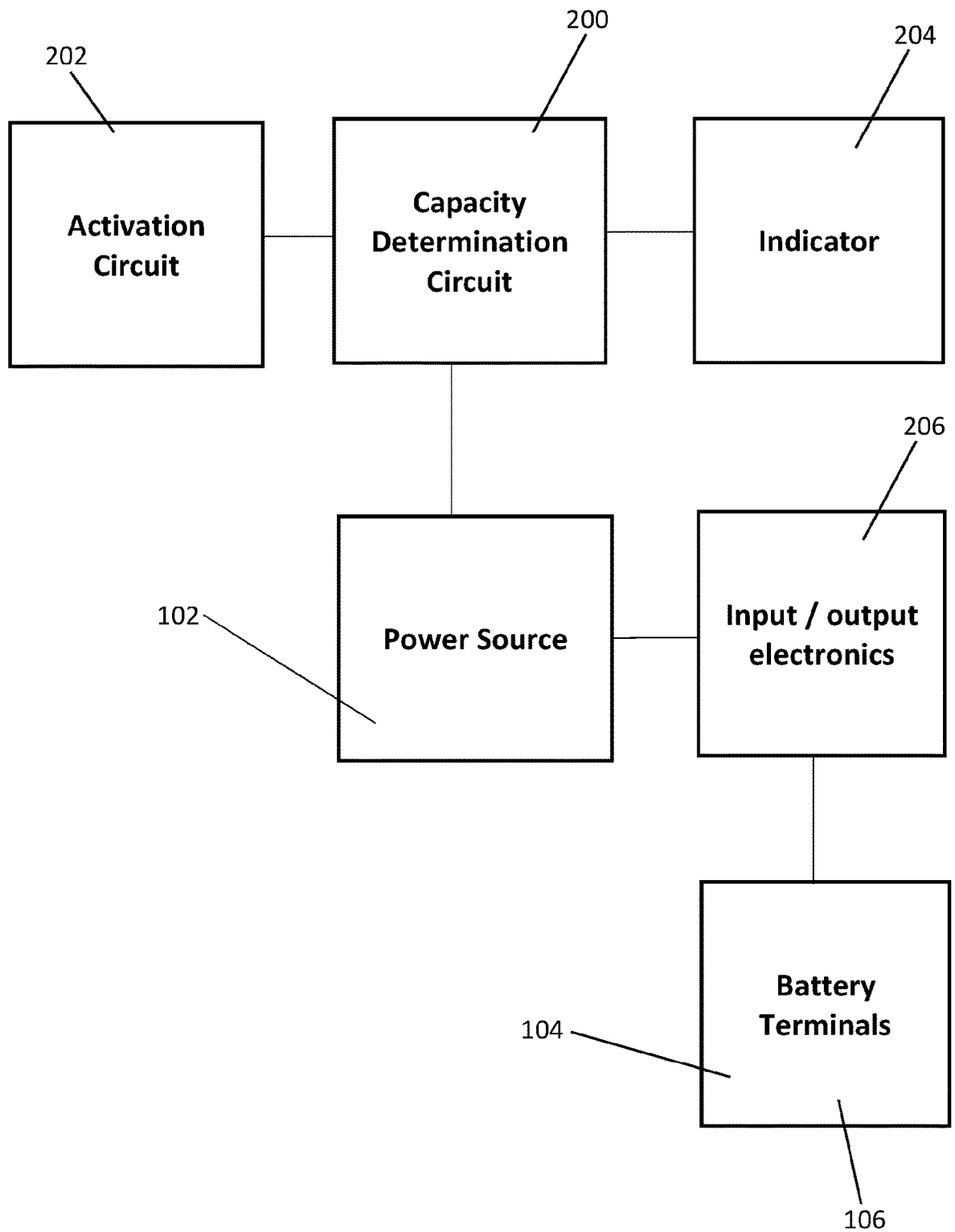
FIG. 2 shows a block diagram of electronic components according to an embodiment of the present technology.

FIG. 2 is a block diagram of the electronic components 110 according to a preferred embodiment of the present technology. The electronic components 110 may comprise a battery capacity indicator configured to provide an indication of a battery 100 within which it is housed.

As shown, the electronic components 110 may include one or more of the following:

A capacity determination circuit 200;
An activation circuit 202;
An indicator 204; and
Input/output electronics 206.

Each of these components may be operatively connected to the internal power source 102 and/or the terminals 104, 106 of the battery 100. The function of each of these components is discussed below.

Capacity Determination Circuit

The capacity determination circuit 200 is configured to determine a capacity of the power source 102 of the battery 100. This information is relayed to an indicator 204 through a signal representative of the determined capacity of the power source 102 as will be discussed in further detail below.

Throughout the present specification, unless the context clearly requires otherwise, reference to "determining" or the "determined" capacity should be understood to include both precise measurements of the capacity of the power source (or a parameter indicative of the capacity of the power source) as well as approximations or estimates of the capacity of the power source.

The capacity determination circuit 200 may be configured to determine the capacity of the battery 100 in a number of different ways. For example, the capacity determination circuit 200 may determine the capacity of the battery 100 using one or more of the following methods:

Measuring the voltage of the power source 102;
Accumulating the charge discharged from or charged into the power source 102 (for example, coulomb counting);

Calculating the internal resistance of the power source 102, by measuring the voltage of the power source 102 at one or more load currents. For example, the capacity determination circuit 200 may measure the voltage of the power source 102 under a substantially zero load condition, then apply a known load such as a 50 mA load and measure the voltage again to determine how much voltage is dropped across the internal resistance of the battery 100;

Estimating the capacity of the battery 100 based on time, i.e. approximating the self-discharge of the battery; and Comparing the discharge response of the battery 100 to known discharge curves for the given battery chemistry.

Componentry suitable to determine the capacity of the battery 100 using these methods will be apparent to the skilled addressee.

It should be understood that the capacity determination circuit 200 may be configured to determine the capacity of the battery 100 using one or more of the above methods. For example, in cost-sensitive applications, it may be adequate to simply provide capacity estimation based on power source 102 voltage measurements alone. In contrast, in applications requiring precise measurement, capacity determination may include a combination of voltage, measurement, coulomb counting, and internal battery resistance calculations.

The capacity determination circuit 200 may not need to be able to provide an absolute determination of capacity, and in some applications, a relative measure may be adequate, such as a percentage indication of the total rated capacity. For example, in a battery 100 containing a lithium-ion power source 102, a measured voltage of 4.2V may correlate to a capacity of approximately 100%, 3.9V may correlate to a capacity of approximately 75% charge, 3.75V may correlate to a capacity of approximately 50%, 3.7V may correlate to a capacity of approximately 25%, and 3V may correlate to a capacity of approximately 0%.

While the present discussion is made in relation to a capacity determination circuit 200 configured to determine battery capacity through a direct determination method, this should not be seen as limiting on embodiments of the technology. In some embodiments, the capacity determination circuit 200 may be configured to alternatively and/or additionally determine one or more parameters of the battery 100 that may be considered to be indirectly representative of battery capacity, or otherwise, such as:

The remaining capacity of the battery 100 (for example, relative or absolute remaining capacity);

The rated capacity of the battery 100;

The voltage of the power source 102, for example the instantaneous, average, or historic voltage(s) such as maximum or minimum values observed.

The current flowing into or out of the power source 102, for example the instantaneous, average, or historic current(s) such as maximum or minimum values observed.

The temperature of the power source 102, for example the instantaneous, average, or historic temperature(s) such as maximum or minimum values observed.

An estimate of the amount of time the battery 100 will continue to operate based on the present or average discharge current;

An estimate of the amount of time until the battery 100 is charged;

An indication of the state of health of the battery 100. For example, in a rechargeable battery the electronics 110 may provide an indication of how the maximum capacity of the battery has degraded from the rated capacity over time/charge cycles; and Historic data about the battery 100, for example the age of the battery, the number of charge/discharge cycles.

Figure 3:
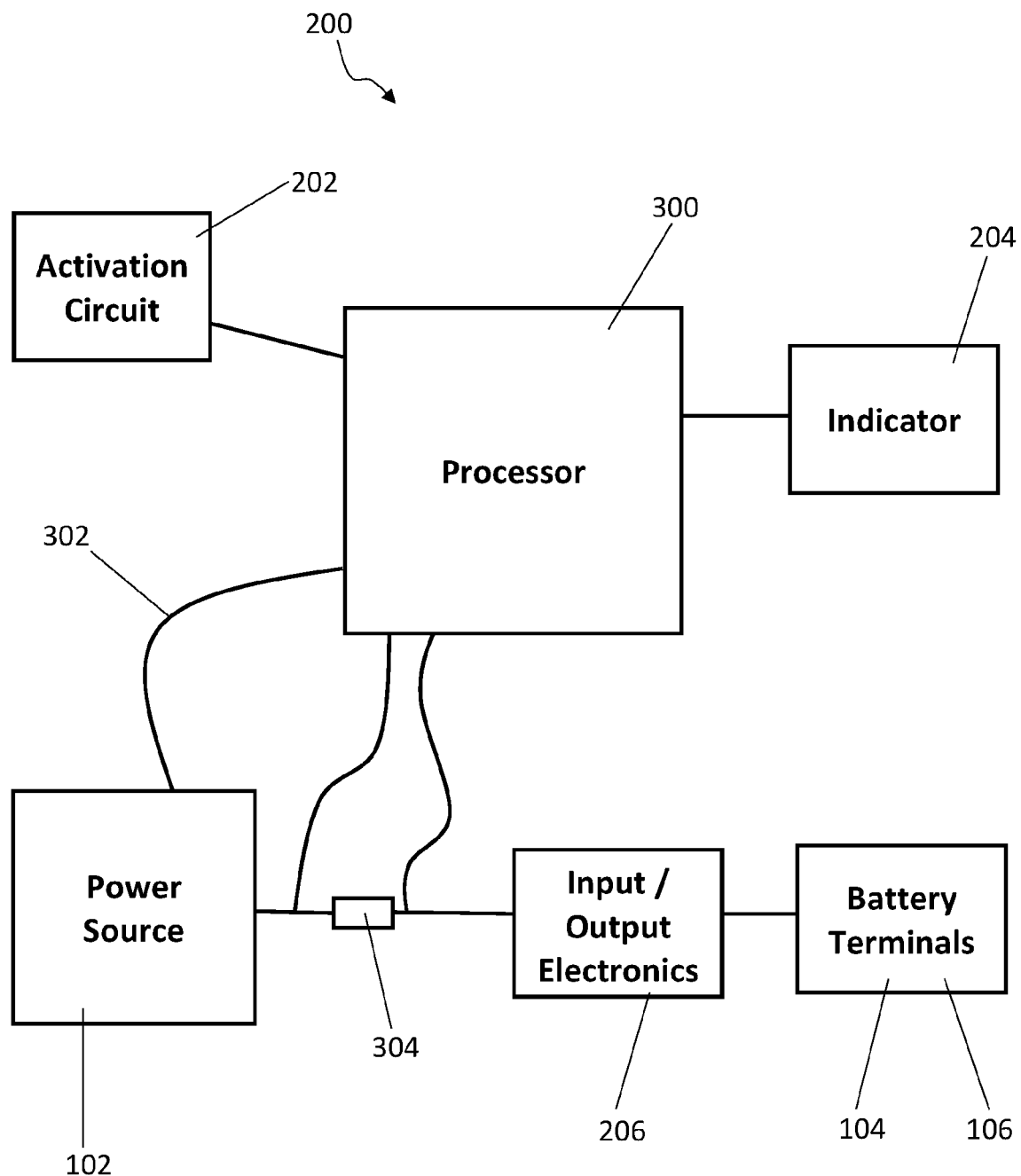
FIG. 3 shows a block diagram of an exemplary capacity determination circuit which utilises a processor for the capacity measurement according to an embodiment of the present technology.

In one embodiment of the technology the capacity determination circuit 200 includes a processor 300 as shown in FIG. 3. Preferably the processor 300 comprises one or more electrical connections 302 to the power source 102. For example, the processor 300 may be configured to measure the voltage of one or more cells of the power source 102, by operatively connecting (either directly or via intermediate electronics 110 such as a voltage divider) these cells to an analogue input on the processor 300. The processor 300 may then be configured to provide an analogue to digital conversion of the voltage for the purposes of determining the capacity of the battery 100.

It should also be appreciated that the capacity determination circuit 200 may comprise one or more current detecting elements in series with the power source 102. For example, these current detecting elements may be resistors such as current sense resistors 304. Current sense resistors 304 typically have a resistance in the order of milli-ohms in order to not adversely affect the performance of the battery 100. By measuring the differential voltages across the current sense resistor 304, it may be possible to determine the amount of current flowing in the circuit. It will be appreciated by those skilled in the art that a differential voltage may first be amplified, for example by an operational amplifier in order to provide a higher voltage signal to the processor 300.

In one embodiment of the technology the processor 300 may be configured to enter one or more low power states, such as a sleep state, or powered-off state. Use of a low-power state may advantageously reduce the total power draw on the battery 100, thereby extending the useful life of the battery 100. For example, it may be advantageous to reduce the current draw of the electronics 110 to less than 10 μA when in the low-power state. This low-power state may be enabled by reducing the clock speed of the processor 300, removing power to particular peripherals of the processor 300, reducing the voltage of one or more of the power rails which supply the processor 300 or a combination of the above measures. Alternatively, in some embodiments it may be advantageous to completely power down the processor 300 when not in use to further reduce the low-power state current draw.

One means of taking the processor 300 out of said low-power state and to an active state is to provide an activation circuit 202 as will be discussed in more detail below. For example, this activation circuit 202 may be configured to generate an interrupt which is configured to switch the processor 300 back into its normal power state, or alternatively simply provide a signal which indicates to the processor 300 that the processor 300 should relay information regarding the battery 100 via the indicator 204.

In applications where power is removed from the processor 300 in its entirety, it may be advantageous for the activation circuit 202 to latch the power to the processor 300, either for a pre-determined period of time, or until a signal is received from the processor 300 which indicates that the processor 300 has completed its task.

Figure 4:
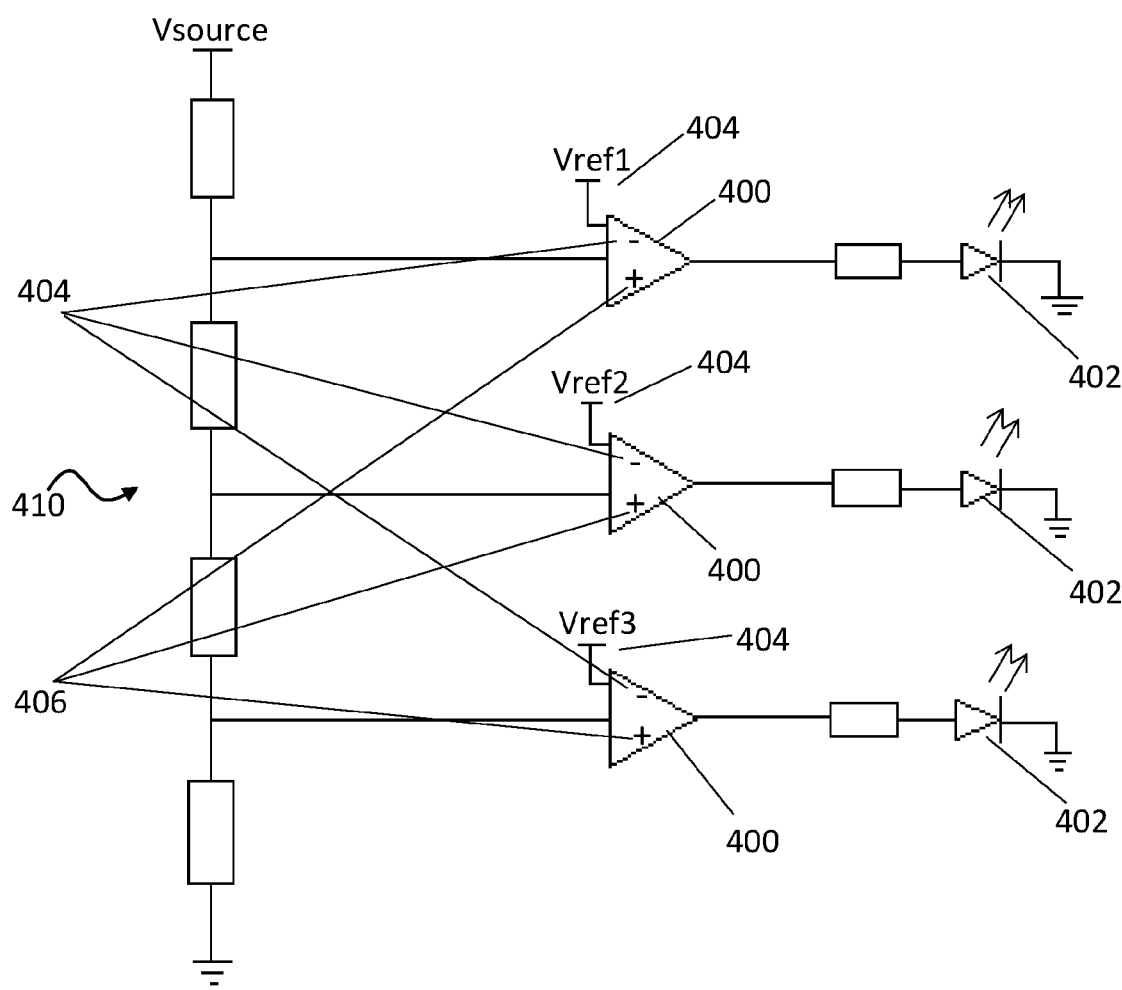
FIG. 4 shows a simplified schematic of circuit according to an embodiment of the technology in which the capacity measurement is done using discrete electronic components.

In an alternative embodiment of the technology, it may be advantageous to implement the capacity determination circuitry 200 using discrete electronics 110. This may advantageously provide a lower-cost solution and/or have a smaller footprint than alternative embodiments comprising processors 300. An exemplary circuit diagram is illustrated in FIG. 4 which provides one means for producing a low-cost capacity determination circuit 200 which operates using discrete electronics 110.

In this embodiment, a series of operational amplifiers or comparators 400 are used to illuminate one or more LEDs 402 to provide an indication of the battery voltage and therefore capacity. In simple terms, this circuit operates by establishing fixed references 404 on each of the inverting inputs 406 of the comparators 400, and compares these fixed references 404 to a voltage of the power source 102 which is provided to the non-inverting inputs 408 on the comparators 400. When the voltage on the non-inverting inputs 408 exceed that of the inverting inputs 406, the output of the comparators 400 goes high and the LEDs 402 are illuminated. The specific thresholds for enabling each of the LEDs 402 may therefore be set by varying the values of the resistors in the resistive divider chain 410, or alternatively by providing a different fixed voltage reference 404.

It should be appreciated that this example is provided by way of example only, and that alternative means of providing capacity determination using discrete electronics 110 should be apparent to those skilled in the art. Furthermore, specific aspects of this design, such as generating a suitable voltage reference should be well known to those skilled in the art, and may be achieved for example by using a Zener diode or similar reference. It should also be appreciated, that the divider chain 410 illustrated in FIG. 4 is provided by way of example only. In alternative embodiments, each of the non-inverting 408 inputs may be joined together and have a common connection to the power source 102. In this embodiment, the switching thresholds will be defined by the reference voltages used on the inverting inputs 406 alone. It should also be appreciated that the connections to the inverting 406 and non-inverting 408 inputs are somewhat arbitrary, as is the output state of the comparators 400. For example, the fixed reference may instead be provided to the non-inverting 408 input, and the power source 102 reference provided to the inverting input 406. The indicating LEDs can similarly be rearranged such that they are enabled when the comparator 400 output is low.

It may further be advantageous for the capacity determination circuit 200 to have a low-power consumption. In this way determination of the battery capacity does not in itself cause a significant reduction in the battery capacity. This may be achieved in a number of ways according to various embodiments of the technology.

In one embodiment, the electronic components 110 of the capacity determination circuit 200 may be selected and/or configured in such a manner as to reduce the overall power consumption of the circuit. For example, low-power consumption parts may be selected, and voltage divider networks may be configured with high impedance components to reduce the overall power draw.

In an alternative embodiment, it may be advantageous to avoid supplying power to the capacity determination circuit 200 when it is not in use. In this way the capacity determination circuit 200 draws reduced power or no power when not actively determining battery capacity. For example, the capacity determination circuit 200 may be powered by a common power rail which is switched off and on as required.

In embodiments comprising a processor 300, it may be advantageous to switch the processor 300 into a low-power operating mode when not actively providing a capacity determination. This may be achieved, for example, by putting the processor 300 into a sleep state until an interrupt is received to revert the processor 300 to the active state. In a preferred embodiment, the processor 300 is configured to enter the active state based on a signal from an activation circuit 202. Once in the active state, the processor 300 may determine the battery capacity, and relay a signal representative of the capacity to the indicator 204. When this process is complete, the processor 300 may revert to its sleep state once more.

Activation Circuit

One aspect of embodiments of the present technology is an activation circuit 202 which is configured to activate a capacity determination circuit 200. Using an activation circuit 202 may advantageously reduce the total power consumption of the electronics 110 compared to having a permanently active capacity determination circuit 200, such that the total power draw on the battery 100 is reduced.

The foregoing discussion refers to the activation circuit 202 as "activating" the capacity determination circuit 200. It should be understood throughout this specification that reference to activation of the capacity determination circuit 200 includes waking the circuit from a low-power or off state and/or providing power to the capacity determination circuit 200.

It may be advantageous for the activation circuit 202 to be housed entirely within the housing 108 of the battery 100 as shown in FIG. 1. However, this should not be seen as limiting to embodiments of the technology. Housing the electronics 110 entirely within the housing 108 of the battery 100 may in some cases provide a lower-cost solution which can be achieved without requiring any components to be embedded within the battery label 112. In addition, housing the electronics 110 within the housing 108 of the battery 100 may provide a measure of protection against damage.

There may be additional benefits to including the activation circuit 202, and/or capacity determination circuit 200 internally to the battery 100 in smart battery applications. In particular, it may be possible to use or adapt the existing electronics 110 which provides the smart battery functionality to also provide the capacity determination/activation functionality.

In the preferred embodiment of the technology, the activation circuit 202 utilises an input means in the form of a sensor which, following sensing of the appropriate input, triggers the generation of an activation signal. For example, the sensor may be an accelerometer, microphone, light sensor, pressure sensor, audio sensor or gyroscope. Alternatively the input means may be touch-based, for example it may include a mechanical, capacitive, inductive or resistive touch interface or button.

It may be advantageous for the activation circuit 202 to require a specific sequence of inputs from the sensor prior to activating the capacity determination circuit 200. In this way it may be possible to mitigate the occurrences of unintended activations. For example, where an accelerometer is used, it may be advantageous to require two or more acceleration values which meet one or more predetermined condition(s) or exceed a predetermined threshold(s) in order to activate the activation circuit 202. For example, the predetermined condition or threshold may be configured such that the activation circuit requires two relatively high-amplitude, short-duration acceleration values such as produced by two or more impacts on the battery 100. For example, the battery 100 may need to be tapped against a hard surface two or more times to activate the activation circuit 202. The activation circuit may further require that a specific sequence of inputs is provided within a predetermined time period, such as within 2 seconds to further reduce the likelihood of unintended activations.

It should be understood that the use of an accelerometer in the foregoing example should not be seen as limiting on the technology and, irrespective of the form of the sensor, the activation circuit 202 may be configured with one or more predetermined conditions or thresholds for the sequence of inputs, such as frequency, duration, direction, intensity, or timing. For example, where a sound sensor is used, the activation circuit 202 may be configured to be activated upon receiving a sequence of inputs which meet one or more predetermined conditions, or exceed one or more predetermined thresholds, relating to signals sensed by the sound sensor, such as frequency, duration, intensity (i.e. volume or amplitude), in order to activate the activation circuit 202. It should further be appreciated that the predetermined condition may consist of low thresholds such as requiring that the frequency of the input is below a specific threshold, or occurs for a period of time which is less than a predetermined value. In some embodiments, the activation circuit may be configured to use pattern recognition methods to recognise patterns in one or more received signals to determine that the sequence of inputs is sufficiently similar (e.g. within certain thresholds of parameters characterising the pattern of input signals) to a predetermined pattern that is required to activate the capacity determination circuit.

Detection of the required sequence of inputs may be implemented using an appropriately programmed processor 300. For example, the processor 300 may be configured to monitor the state of the sensor (or wake on an input from the sensor) to ensure that the inputs are received with the appropriate timing and/or intensity to trigger the activation circuit 202. In some embodiments, the sensor may be configurable to generate an output signal or interrupt only when the input signal reaches a pre-determined threshold based on intensity, direction and/or duration. This approach may advantageously allow the processor 300 to remain in an off-state or low-power state until an appropriate input signal is received.

In an alternative embodiment, detection of the required sequence may be implemented with discrete electronics 110. For example, filtering may be applied to the input signal such that input signals containing the desired frequency, duration, intensity and/or sequence are passed to the activation circuit 202, where signals which fall outside the desired parameters are instead attenuated or ignored. Selection of suitable discrete electronics 110 will depend on the desired activation sequence, and should be apparent to the skilled addressee.

Figure 5:
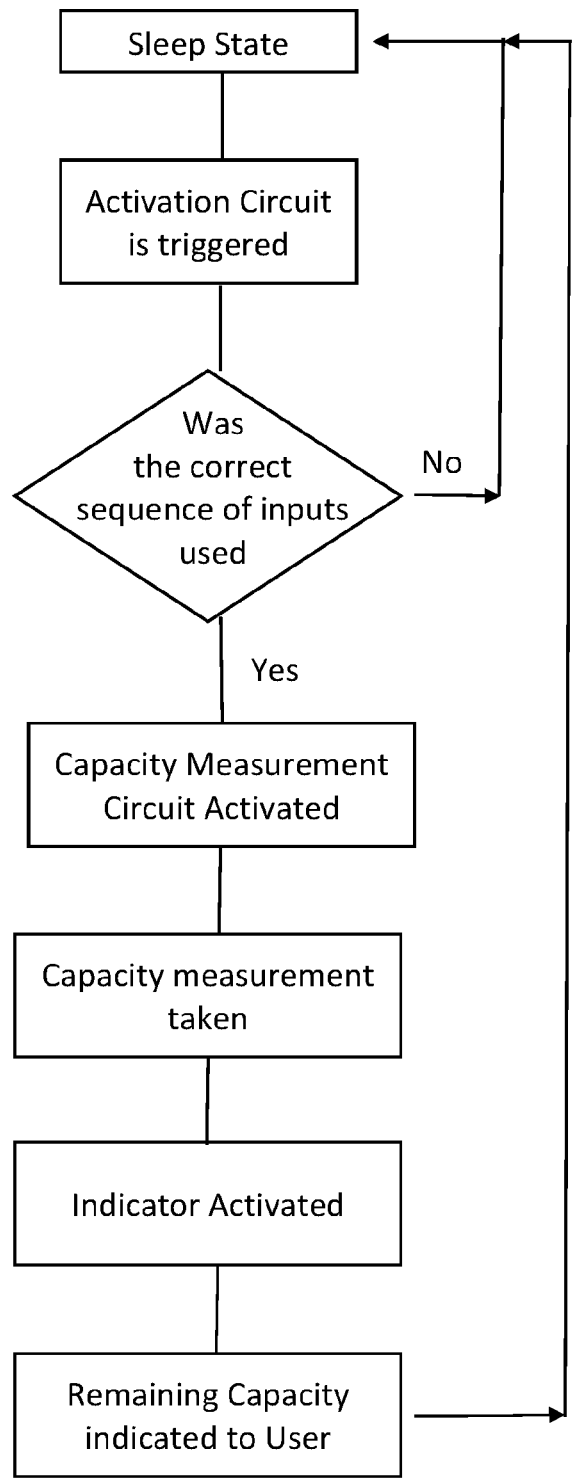
FIG. 5 shows a flow-diagram which illustrates an exemplary embodiment of how the capacity determination circuit may be kept in a low-power state.

FIG. 5 illustrates a flow diagram of a method of operation of the activation circuit 202 according to one embodiment of the present technology. As shown, the idle state of the system is for the capacity determination circuit 200 to reside in a sleep state, where the circuit is inactive. Once the activation circuit 202 has been triggered by a sensor input, the circuit checks to see whether the correct sequence of inputs has been provided. If the correct sequence is not provided within a predetermined time period, the electronics 110 return to the sleep state. If the correct sequence is provided, the capacity determination circuit 200 is activated, a determination made, and a signal representative of the determined capacity relayed to the indicator 204. The electronics 110 are then configured to return to the sleep state once more.

It may be further advantageous for the activation circuit 202 or other components of the technology to disable the capacity determination circuit 200 when a load is being drawn from the power source 102. For example, when the battery 100 is being used in a product. Disabling the capacity determination circuit 200 in this state may advantageously reduce the idle current draw of the battery 100.

Capacity Indicator

In the preferred embodiment of this technology, the capacity of the battery 100 is indicated to a user via an indicator 204. The indicator may be configured to provide an indication of battery capacity to an appropriate or selected degree of accuracy. For example, in one embodiment the indicator may provide a relatively precise indication of capacity, such as a percentage figure for capacity remaining or other quantitative indication, while in other embodiments the indicator may provide an approximate indication of capacity for example a qualitative indication or discrete categorisation of capacity, such as low/medium/high. In some embodiments the indicator 204 may be a visual indicator, such as an LED. However, this should not be seen as limiting on embodiments of the technology. For example, the indication may additionally or alternatively be provided by audible or tactile feedback using a buzzer, speaker or vibration mechanism.

The capacity of the battery 100 may be communicated by any number of methods. For example, where an LED is used, a sequence of flashes may be used to indicate the level of charge. i.e. five flashes could indicate full charge, three flashes half charge and one flash low or no charge. Alternatively, a multi-colour or tri-colour LED could be used, and the colour of the LED could be used to indicate the charge state. i.e. green for fully charged, orange for half charged and red for flat.

Alternative methods of communicating the battery capacity may include a specific sequence or duration of vibrations, beeps, or flashes, sounds, tones, or even synthesised/recorded speech which announces the charge level.

In one embodiment the battery capacity is communicated by the indicator 204 by means of the battery capacity indicator comprising a suitably programmed processor 300 which is configured to drive the visual/audible/tactile feedback mechanism such as the LED, buzzer, speaker or vibration motor. Alternatively, the battery capacity indicator may comprise discrete electronics 110 configured to control the indication mechanism. One exemplary implementation of providing a variable pulse sequence is to use a 555-timer. Variations to the number of pulses or pulse rate may be achieved by switching in resistors or capacitors using switching elements such as transistors depending on the detected capacity. For example, the circuit illustrated in FIG. 4 could be used to drive switching elements of the 555 circuit rather than the LEDs illustrated. Again, selection of suitable discrete electronics 110 will depend on the desired indication sequence and should be apparent to the skilled addressee.

Where a visual indicator 204 is used, this is preferably mounted within the housing 108 of the battery 100, however in an alternative embodiment it may be located within or under the label 112 of the battery 100. In embodiments where the visual indicator 204 is mounted within the housing 108 of the battery 100, it may be advantageous to provide a translucent or transparent region of the housing 108 in order to allow light from the visual indicator 204 to be visible to the user.

In an alternative embodiment of the present technology, the indicator 204 may be configured to relay the capacity information to an external device such as a smartphone, watch, tablet, computer or other external device. This relay of information may be achieved using a wireless communication interface configured to transmit information over Bluetooth™, WiFi, NFC or any other suitable wireless network or protocol.

In a yet further alternative embodiment, the indicator 204 may be configured to relay the capacity information via the terminals 104, 106 of the battery 100. For example, the indicator 204 may use a two-wire communication protocol such as I²C to relay the capacity information to an external device via the terminals 104, 106 of the battery 100. Alternatively, when used in a smart battery, the indicator 204 may vary the output voltage on the terminals 104, 106 of the battery 100 to provide an indication of the capacity of the internal power source 102. For example, the activation circuit 202 may be configured to disable the input/output electronics 206 or otherwise operatively connect the power source 102 to the battery terminals 104, 106 such that a standard capacity detector may be used.

In a yet further embodiment, the battery 100 may comprise further electrical connections for communicating the battery capacity to an external device. For example, the battery label 112 may include an electrically conductive region which provides an electronic signal which is indicative of the capacity of the battery 100. This electronic signal may be analogue, for example it may provide a voltage level representative of the battery capacity. Or alternatively the electronic may be digital, for example the electronic signal may comprise a series of pulses which indicate the battery capacity.

EXEMPLARY EMBODIMENT OF ELECTRONICS

Figure 6:
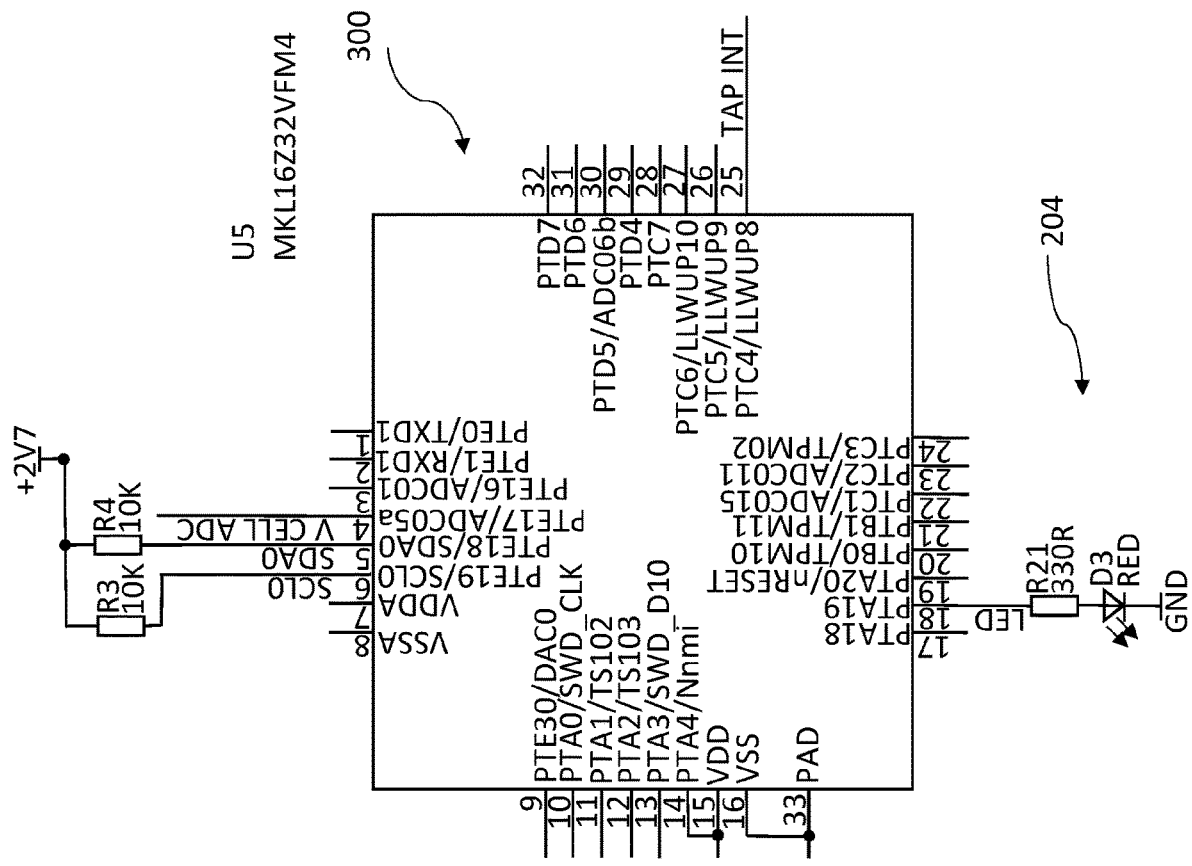
FIG. 6 shows circuit diagrams of exemplary electronic circuits comprised as part of a battery capacity indicator according to an embodiment of the present technology.
Figure 6:
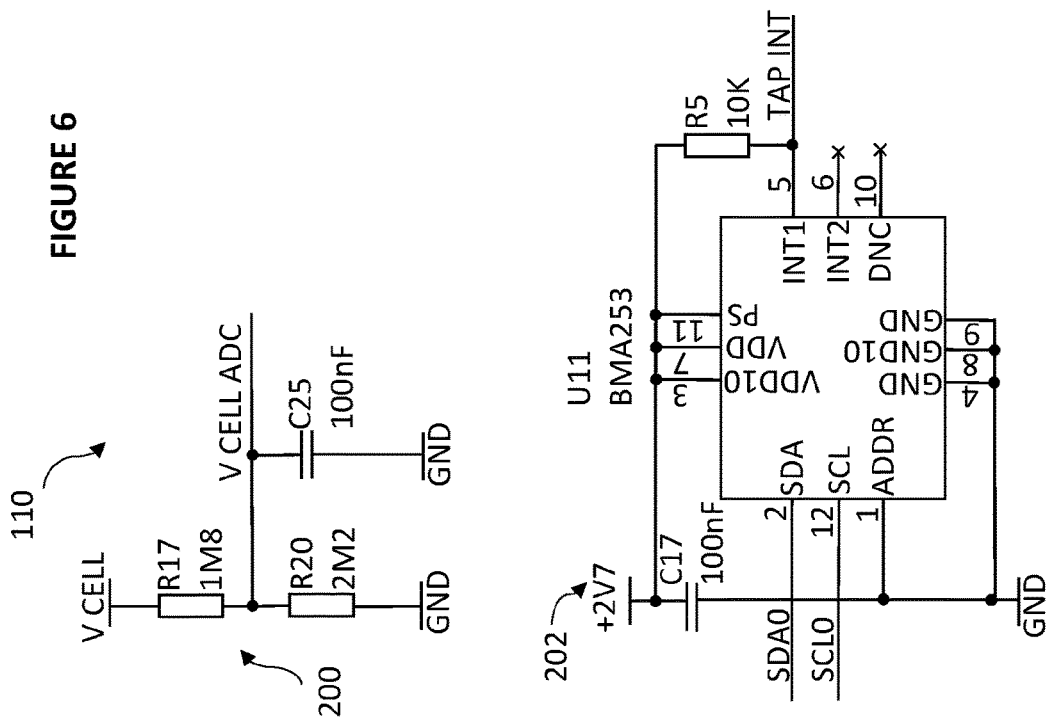

Exemplary electronic circuits 110 comprised as part of a battery capacity indicator according to an embodiment of the present technology are illustrated in FIG. 6. In this embodiment the capacity determination circuit 200 is provided by a resistive divider which includes resistors R17 and R20. As this resistive divider continuously applies a load to the power source 102 it is desirable to have high value resistors to minimise the total current draw; see for example the 1.8 MΩ and 2.2 MΩ resistors illustrated by way of example. It should however be appreciated that this constant current drawn arrangement is provided by way of example only and in alternative embodiments the voltage divider may be switched in or out of the circuit as required. For example, in other embodiments a bipolar junction transistor (BJT) or field-effect transistor (FET) may be positioned between the cell voltage and R17 or alternatively between R20 and the ground connection as would be appreciated by those skilled in the art.

Also provided in the exemplary embodiment is a 100 nF capacitor C25 which may assist in filtering the input signal, particularly in relation to any conducted or radiated noise which may interfere with the voltage measurement.

Careful selection of the values of the components in the resistive divider ensures that for the expected range of power source 102 voltages, the voltage present at the analogue to digital converter (ADC) (pin 4 of the processor 300) remains within the rated limits of the ADC.

An exemplary embodiment of an activation circuit 202 is also depicted in FIG. 6. In this embodiment a dedicated integrated circuit (IC) is used, namely the BMA253 accelerometer made by Bosch Sensortec; see U11. It should be appreciated that this IC is one of many possible components which would be suitable in this application. Usefully this IC includes an interrupt output (pin 5) which can generate an active low signal to wake the processor 300 from its sleep or idle state when sufficient acceleration is detected. The accelerometer also includes a I²C interface for communicating acceleration values to the processor; see pins 2 and 12 of U11.

This embodiment also includes an indicator 204 in the form of an LED (D3). This LED is arranged such that an active high signal on pin 18 of the processor results in illumination of the LED. However, other suitable methods of driving an LED, as will be apparent to those skilled in the art, may be provided instead or in addition.

In a preferred embodiment the circuit illustrated in FIG. 6 operates as follows:

On detection of a double-tap sequence, the activation circuit 202 generates an interrupt which wakes the processor 300 if the processor is not already in an active state;

The processor 300 measures the voltage on pin 4 which is indicative of the power source 102 voltage;

The processor 300 then determines what the state of charge of the power source 102, using pre-programmed voltage reference values; and The processor 300 activates the indicator 204 with a suitable sequence of LED flashes according to the measured capacity.

One exemplary flash sequence may be:

One flash, to indicate that the power source has between 0% and 20% capacity remaining;

Two flashes, to indicate that the power source has between 20% and 40% capacity remaining;

Three flashes, to indicate that the power source has between 40% and 60% capacity remaining;

Four flashes, to indicate that the power source has between 60% and 80% capacity remaining; and Five flashes, to indicate that the power source has between 80% and 100% capacity remaining.

The above flash sequence is provided by way of example only and any other suitable sequence of flashes that is able to convey a variety of levels of power capacity may be used in alternative embodiments of the present technology. In one alternative embodiment, the selective illumination of different colour lights may be used to indicate different power capacity levels. In another alternative embodiment, the selective illumination of a light source at different intensity levels may be used to indicate different power capacity levels.

The foregoing description describes the technology in relation to preferred examples. The technology is in no way limited to the example(s) and/or drawings as they are purely to exemplify the technology only and that possible variations and modifications would be readily apparent without departing from the scope of the technology.

Furthermore, while the foregoing description refers to specific circuits of the technology, it should be understood that these circuits need not be distinct from one another. For example, the activation circuit 202 may simply be a part of the capacity determination circuit 200.

Unless the context clearly requires otherwise, throughout the description and the claims, the words "comprise", "comprising", and the like, are to be construed in an inclusive sense as opposed to an exclusive or exhaustive sense, that is to say, in the sense of "including, but not limited to".

The entire disclosures of all applications, patents and publications cited above and below, if any, are herein incorporated by reference.

Reference to any prior art in this specification is not, and should not be taken as, an acknowledgement or any form of suggestion that that prior art forms part of the common general knowledge in the field of endeavour in any country in the world.

The technology may also be said broadly to consist in the parts, elements and features referred to or indicated in the specification of the application, individually or collectively, in any or all combinations of two or more of said parts, elements or features.

Where in the foregoing description reference has been made to integers or components having known equivalents thereof, those integers are herein incorporated as if individually set forth.

It should be noted that various changes and modifications to the presently preferred embodiments described herein will be apparent to those skilled in the art. Such changes and modifications may be made without departing from the spirit and scope of the technology and without diminishing its attendant advantages. It is therefore intended that such changes and modifications be included within the present technology.

What I claim is:

1. A battery capacity indicator configured for use with a battery, the battery having a power source and an external surface which is substantially defined by a housing, a positive terminal, and a negative terminal, the battery capacity indicator comprising:
   an activation circuit;
   a capacity determination circuit; and
   an indicator;
   wherein the activation circuit is configured to activate the capacity determination circuit in response to detection of a sequence of taps on the battery,
   wherein the capacity determination circuit is configured, when activated, to determine a capacity of the power source, and to communicate a signal representative of the capacity to the indicator, and
   wherein the indicator is configured to indicate capacity information representative of the determined capacity to a user in response to the signal representative of the capacity.

2. The battery capacity indicator as claimed in claim 1, wherein the activation circuit is configured to switch the capacity determination circuit between a low-power state or off state and an active state, and wherein in the active state the capacity determination circuit determines the capacity of the power source.

3. The battery capacity indicator as claimed in claim 1, wherein the activation circuit comprises a sensor configured to detect the taps, wherein the sensor comprises one or more of: an accelerometer, a microphone, a pressure sensor, or a gyroscope.

4. The battery capacity indicator as claimed in claim 1, wherein information associated with the taps is compared against predetermined thresholds for one or more of intensity, amplitude, duration, frequency and direction information.

5. The battery capacity indicator as claimed in claim 1, wherein the activation circuit is configured to activate the capacity determination circuit when the sequence of taps is provided within a predetermined time period.

6. The battery capacity indicator as claimed in claim 1, wherein the indicator comprises one or more of: a light emitting diode (LED), buzzer, speaker, and vibration motor.

7. The battery capacity indicator as claimed in claim 1, further comprising a processor.

8. The battery capacity indicator as claimed in claim 7, wherein the activation circuit activates the capacity determination circuit by providing an interrupt signal to the processor.

9. The battery capacity indicator as claimed in claim 1, wherein the capacity determination circuit is configured to determine the capacity by using one or more of the following methods:
   a) measuring the voltage of a power source;
   b) accumulating the charge discharged from or charged into the power source;
   c) calculating the internal resistance of the power source;
   d) estimating the capacity of the battery based on time elapsed; and
   e) comparing the discharge response of the battery to known discharge curves for the battery chemistry.

10. A battery comprising:
    an external surface which is substantially defined by:
       a housing;
       a positive terminal; and
       a negative terminal,
    a power source located within the housing;
    an activation circuit;
    a capacity determination circuit; and
    an indicator,
    wherein the activation circuit is configured to activate the capacity determination circuit in response to detection of a sequence of taps on the battery,
    wherein the capacity determination circuit is configured, when activated, to determine capacity of the power source, and to communicate a signal representative of the capacity to the indicator, and
    wherein the indicator is configured to indicate capacity information representative of the determined capacity to a user in response to the signal representative of the capacity.

11. The battery as claimed in claim 10, wherein the battery is an AA, AAA, C, D or 9V battery.

12. The battery as claimed in claim 10, wherein the housing comprises a transparent or translucent region through which the indicator is visible.

13. The battery as claimed in claim 10, wherein the activation circuit is configured to switch the capacity determination circuit between a low-power state or off state and an active state, and wherein in the active state the capacity determination circuit determines the capacity of the power source.

14. The battery as claimed in claim 10, wherein the activation circuit comprises a sensor configured to detect the taps, wherein the sensor comprises one or more of: an accelerometer, microphone, pressure sensor, or gyroscope.

15. The battery as claimed in claim 10, wherein information associated with the taps compared against predetermined thresholds for one or more of intensity, amplitude, duration, frequency and direction information.

16. The battery as claimed in claim 10, wherein the activation circuit is configured to activate the capacity determination circuit when the sequence of taps is provided within a predetermined time period.

17. The battery as claimed in claim 10, wherein the indicator comprises one or more of: a light emitting diode (LED), buzzer, speaker, and vibration motor.

18. The battery as claimed in claim 10, further comprising a processor.

19. The battery as claimed in claim 18, wherein the activation circuit activates the capacity determination circuit by providing an interrupt signal to the processor.

20. The battery as claimed in claim 10, wherein the capacity determination circuit is configured to determine the capacity by using one or more of the following methods:
  a) measuring the voltage of a power source;
  b) accumulating the charge discharged from or charged into the power source;
  c) calculating the internal resistance of the power source;
  d) estimating the capacity of the battery based on time elapsed; and
  e) comparing the discharge response of the battery to known discharge curves for the battery chemistry.

\* \* \* \* \*